United States Patent [19]
Ahn

[11] Patent Number: 5,852,312
[45] Date of Patent: Dec. 22, 1998

[54] FLASH EEPROM CELL

[75] Inventor: Byung Jin Ahn, Seoul, Rep. of Korea

[73] Assignee: Hyundai Electronics Industries Co., Ltd., Kyungki, Rep. of Korea

[21] Appl. No.: 955,375

[22] Filed: Oct. 22, 1997

Related U.S. Application Data

[62] Division of Ser. No. 614,730, Mar. 13, 1996, Pat. No. 5,716,865.

[30] Foreign Application Priority Data

Mar. 14, 1997 [KR] Rep. of Korea .................. 95-5205

[51] Int. Cl.$^6$ ................................. H01L 27/115
[52] U.S. Cl. .................... 257/321; 257/315; 257/316; 257/317; 257/319; 438/264; 438/266
[58] Field of Search .................. 257/315, 316, 257/317, 319, 321; 438/264, 266

[56] References Cited

U.S. PATENT DOCUMENTS

| | | | |
|---|---|---|---|
| 5,231,041 | 7/1993 | Arima et al. | 437/43 |
| 5,445,984 | 8/1995 | Hong et al. | 437/43 |
| 5,585,656 | 12/1996 | Hsue et al. | 257/321 |

*Primary Examiner*—Valencia Wallace
*Attorney, Agent, or Firm*—Scott C. Harris, Esq.

[57] ABSTRACT

The flash EEPROM cell of split-gate type according to the present invention can prevent the degradation of the tunnel oxide film of the cell due to the band-to-band tunneling and the secondary hot carrier which are generated by a high electric field formed at the overlap region between the junction region and the gate electrode when programming and erasure operations are performed by a high voltage to the structure in which the tunneling region is separated from the channel with a thick insulation film.

5 Claims, 5 Drawing Sheets

FLASH EEPROM CELL

This is a divisional of application Ser. No. 08/614,730, filed Mar. 13, 1996 now U.S. Pat. No. 5,716,865.

FIELD OF THE INVENTION

The present invention relates to a flash EEPROM cell and the method of making thereof and, more particularly to a flash EEPROM cell of split-gate type and the method of making thereof, which can improve the reliability of the device by separating the tunneling region and the channel.

BACKGROUND OF THE INVENTION

Generally, in the process of making a semiconductor device, a flash EEPROM (Electrically Erasable Read Only Memory) cell having both functions of electrical programming and erasing may be classified into a stack-gate structure and a split-gate structure.

As shown in FIG. 1A, a conventional flash EEPROM cell of stack-gate type has a structure in which a tunnel oxide film 5, a floating gate 6, an interpoly insulating film 11 and a control gate 12 are sequentially stacked on a silicon substrate 1 between a drain region 7 and a source region 8.

As shown in FIG. 1B, a conventional flash EEPROM cell of split-gate type has a structure in which a tunnel oxide film 5, a floating gate 6, an interpoly insulating film 11 and a control gate 12 are sequentially formed on a silicon substrate 1 between a drain region 7 and a source region 8, it has a stacked structure on the drain region's side 7 and it has a structure in which the control gate 12 comprising the upper layer of the stacked structure extends toward the source region 8. The silicon substrate 1 underlying the extended control gate 12 becomes a select gate channel region 9.

Though the stack-gate structure has an advantage in accomplishing a high density of the device because it can reduce the area per cell compared with the split-gate structure, it however has a disadvantage in that it is over-erased when being erased. Whereas, though the split-gate structure can overcome the disadvantage of the stack-gate structure, it has a disadvantage in accomplishing a high density of the device because it can not reduce the area per cell compared with the stack-gate.

On the one hand, the flash EEPROM cell of stack-gate-type or split-gate type may perform the functions of programming and erasing when a high voltage is applied to the cell. When performing programming and erasing functions using a high voltage, a band-to-band tunneling and secondary hot carriers are generated due to a strong electric field formed at the overlap region between a junction region and a gate electrode. However, the tunnel oxide film is degraded due to generation of the band-to-band tunneling and the secondary hot carrier because the tunnel oxide film of the cell is usually formed thin in thickness of about 100 Å, thereby reducing the reliability of the device.

SUMMARY OF THE INVENTION

The object of the present invention is to provide a flash EEPROM cell and the method of making the same, which can reduce the degradation of the tunnel oxide film due to a high voltage, while solving the over-erasure problem when the cell is erased.

To achieve the above object, a method manufacturing a flash EEPROM cell, comprises the steps of:

a method manufacturing a flash EEPROM cell, comprising the steps of:

forming a buried drain region in a portion of a silicon substrate;

forming a first and a second field oxide layers, wherein said second field oxide layer is formed in said silicon substrate in said buried drain region and said first field oxide layer is formed in a portion of said silicon substrate spaced from said second field oxide layer at a distance;

forming a gate oxide layer on said silicon substrate between said first and second field oxide layers;

sequentially forming a first polysilicon layer and an interpoly insulating layer on the resulting structure after forming said gate oxide layer;

sequentially patterning said interpoly insulating layer, said first polysilicon layer and said gate oxide layer, thereby forming a control gate;

forming a drain region in said silicon substrate between said control gate and said second field oxide layer so that said drain region is connected to said buried drain region;

forming a floating gate oxide layer on the resulting structure after forming said drain region, wherein said floating gate oxide layer on said drain region is formed with thicker than said floating gate oxide layer on the other regions;

etching a portion of said floating gate oxide layer which is formed on said drain region and on second field oxide layer to be exposed a portion where said drain region is overlapped to said second field oxide layer;

removing said floating gate oxide layer in said silicon substrate between said first field oxide layer and said control gate;

sequentially forming a tunnel oxide layer and a second polysilicon layer;

forming a floating gate by patterning said second polysilicon layer; and forming a source region in said silicon substrate between said first field oxide layer and said control gate.

A flash EEPROM cell according to the present invention comprises:

a silicon substrate having a first and a second field oxide layers;

a gate oxide layer, a control gate and an interpoly insulating layer formed on a portion of said silicon substrate between said first and said second field oxide layers in stack structure;

a floating gate oxide layer on a surface of said silicon substrate between said control gate and said second field oxide layer, so that portion of said silicon substrate adjacent to said second field oxide layer is exposed, wherein a portion of said floating gate oxide layer near said control gate is formed thicker than other portion of said floating gate oxide layer near said second field oxide layer;

a buried drain region formed under said second field oxide layer;

a drain region formed under said floating gate oxide layer, wherein said drain region is connected to said buried drain region;

a source region formed in a portion of said silicon substrate between said control gate and said first field oxide layer;

a tunnel oxide layer formed to isolate said silicon substrate, said interpoly insulating layer and said control gate; and a floating gate formed on said tunnel oxide layer.

BRIEF DESCRIPTION OF THE INVENTION

For fuller understanding of the nature and objects of the invention, reference should be made to the following detailed description and the accompanying drawings in which.

Similar reference characters refer to similar parts in the several views of the drawings.

DESCRIPTION OF THE INVENTION

FIG. 2A through 2H illustrate sectional-views for explaining a method of manufacturing a flash EEPROM cell according to the present invention.

Figure 1A:
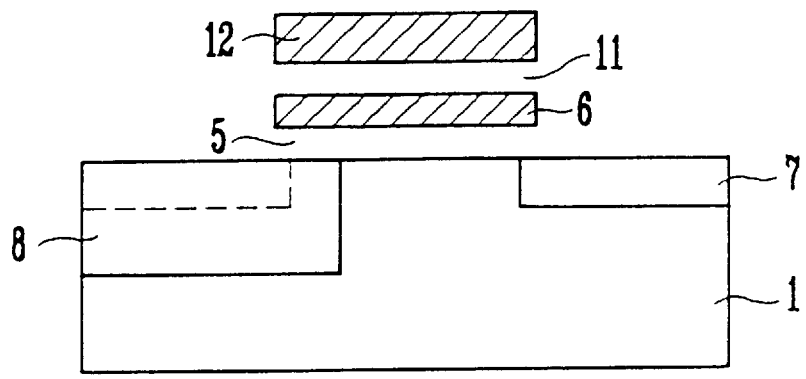
FIG. 1A shows a sectional view of a flash EEPROM cell of a conventional stack-gate type.
Figure 1B:
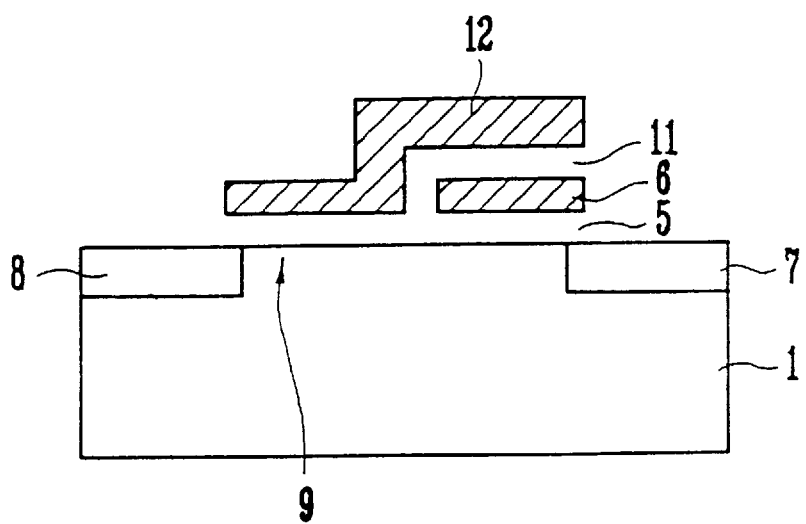
FIG. 1B shows a sectional view of a flash EEPROM cell of a conventional split-gate type.
Figure 2A:
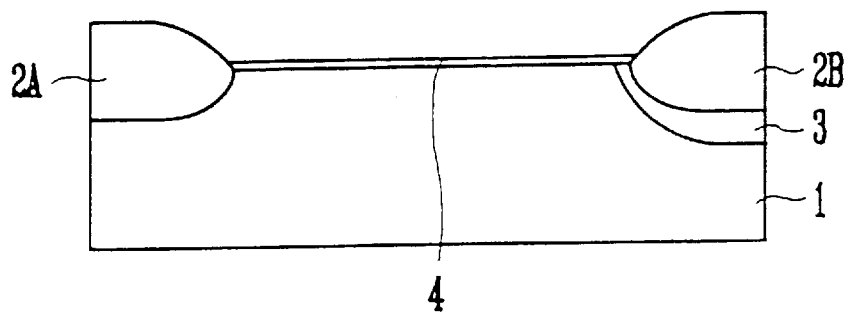
FIG. 2A to FIG. 2H show sectional views of the device for explaining the method of making a flash EEPROM cell according to the present invention.

Referring to FIG. 2A, a buried N$^+$ drain region 3 is formed by implanting N type impurity ions having high concentration in a portion of a silicon substrate 1, and thereafter a first field oxide layer 2A and a second field oxide layer 2B are formed by means of a LOCOS(Local Oxidation of silicon) process with thickness of 2000 through 5000 Å and a gate oxide layer 4 is then formed on the silicon substrate 1 between the first field oxide layer 2A and the second field oxide layer 2B. According to the above process, the second field oxide layer 2B is overlapped to the buried N$^+$ drain region 3.

Figure 2B:
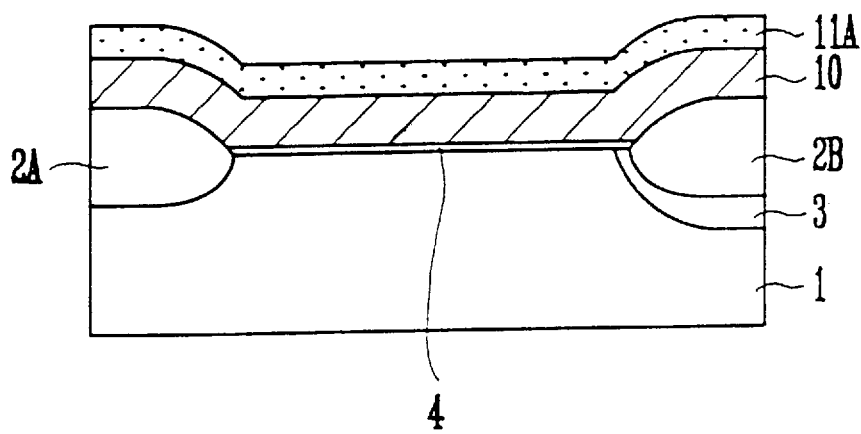

FIG. 2B is a sectional-view illustrating the formation of a first polysilicon layer 10 and an interpoly insulating layer 11A which are sequentially formed on the resulting structure after forming the gate oxide layer 4. If the interpoly insulating layer 11A is formed of an oxide layer and a nitride layer, the oxide layer is formed on the first polysilicon layer 10 by means of the oxidization process and the nitride layer is formed on the oxide layer through the deposition process.

Figure 2C:
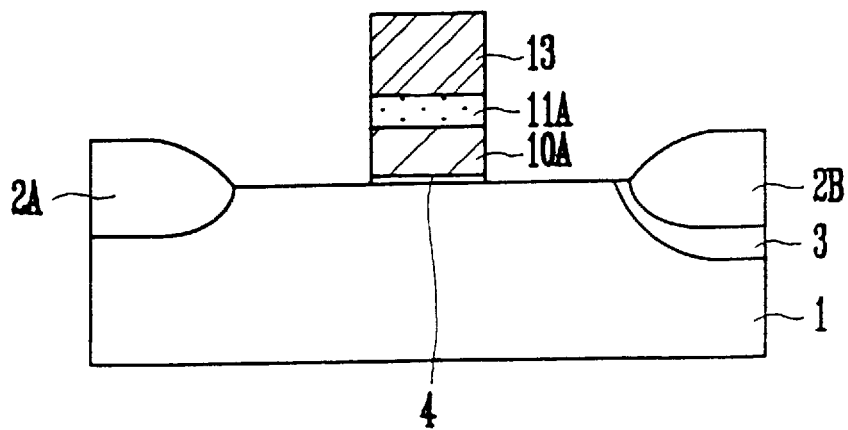

The interpoly insulating layer 11A, the first polysilicon layer 10 and the gate oxide layer 4 are sequentially patterned by means of the etching process using a first photoresist pattern 13 as a mask, thereby forming a control gate 11A as shown in FIG. 2C.

Figure 2D:
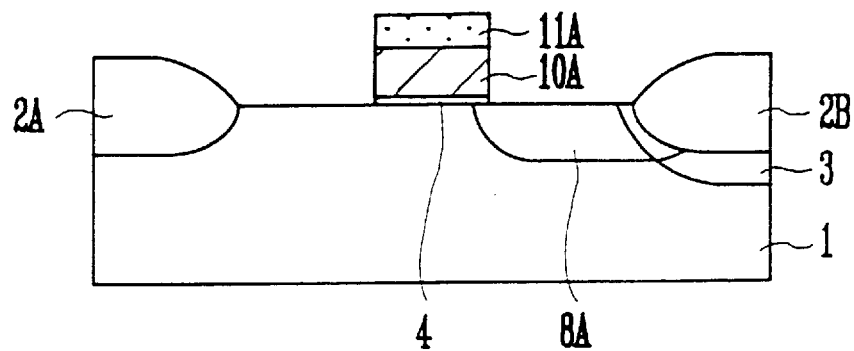

After removing the first photoresist pattern 13, the silicon substrate 1 of a drain region 8A is exposed by a photomask and N type impurity ions having high concentration are implanted to the exposed silicon substrate, and thereby forming the drain region 8A which is connected to the buried N$^+$ drain region as shown in FIG. 2D.

Figure 2E:
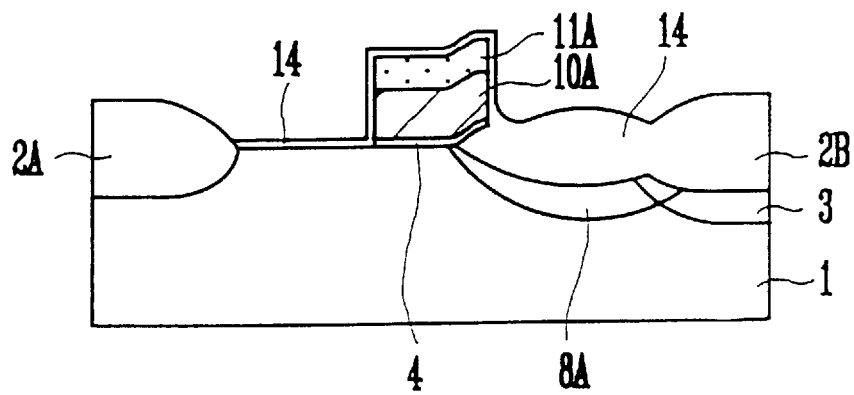

FIG. 2E is a sectional-view illustrating the formation of a floating gate oxide layer 14 which is formed by performing an oxidization process over the entire surface of FIG. 2D. According to the above process, the floating gate oxide layer 14 on the drain region is formed with thicker than that on the other regions of the silicon substrate 1 since the oxidization speed is increased at the silicon substrate 1 of the drain region 8A due to the N type impurity ions which are implanted at the process of FIG. 2D.

Figure 2F:
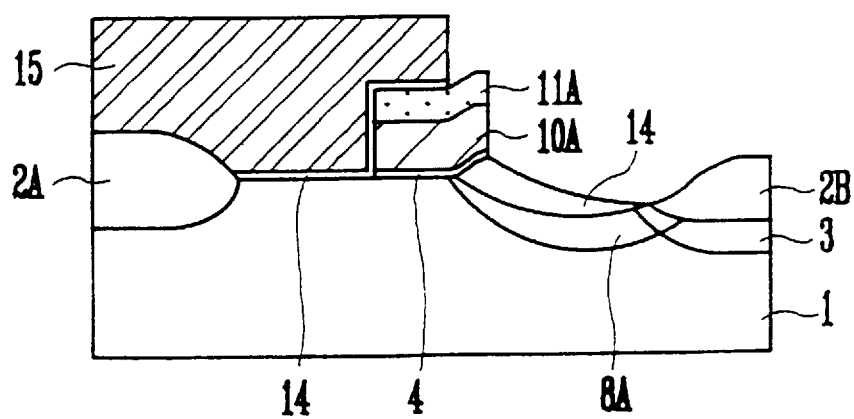

Referring to FIG. 2F, a wet etching process is performed using a second photoresist pattern 15 as a mask to be exposed a portion where the drain region 8A is overlapped to the second field oxide layer 2B, wherein the second photoresist pattern is used for opening the drain region 8A and the second field oxide layer 2B.

Figure 2G:
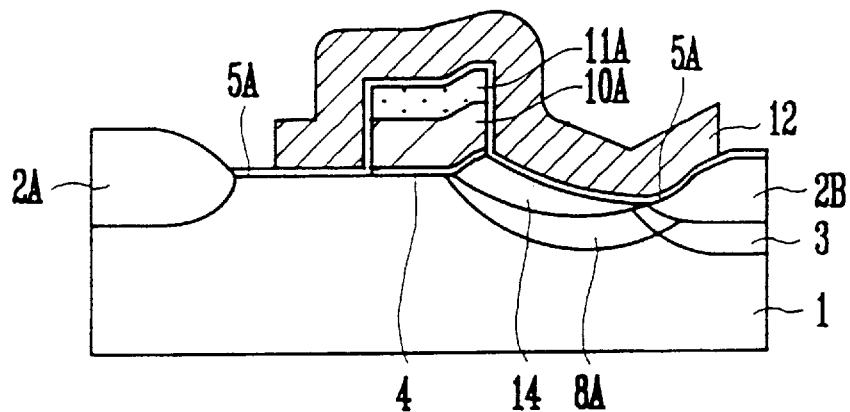

After removing the second photoresist pattern 15 and the floating gate oxide layer 14 covered with the second photoresist layer 15, a tunnel oxide layer is formed of the thickness of 80 through 120 Å on the entire surface of FIG. 2F and a floating gate is then formed by depositing a second polysilicon and patterning the second polysilicon as shown in FIG. 2G.

Figure 2H:
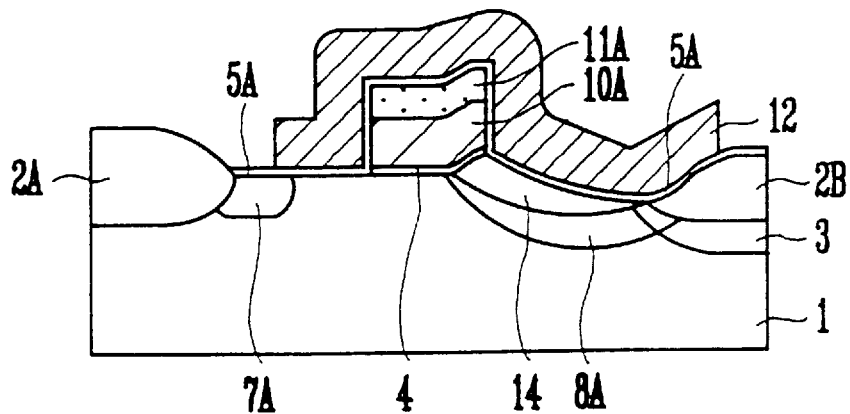

Referring to FIG. 2H, a source region 7A is formed by implanting N type impurity ions having high concentration into the source region 7A of the silicon substrate 1, thereby forming a flash EEPROM cell.

The flash EEPROM cell manufactured by the above processes will be summarized as follows:

A first and second field oxide layers 2A and 2B are formed on a silicon substrate 1. A gate oxide layer 4, a control gate 10A and an interpoly insulating layer 11A are formed on a portion of the silicon substrate 1 between the first field oxide layer 2A and the second field oxide layer 2B. A floating gate oxide layer 14 is formed on the surface of the silicon substrate 1 between the control gate 10A and the second field oxide layer 2B, wherein the floating gate oxide layer 14 adjacent to the control gate 10A is formed with thicker than that adjacent to the second field oxide layer 2B.

A buried drain region 3 is formed under the second field oxide layer 2B. A drain region 8A is formed under a floating gate oxide layer 14, wherein the drain region 8A is connected to the buried drain region. A source region 7A is formed in a portion of the silicon substrate 1 between the first field oxide layer 2A and the control gate 10A. A floating gate that extends to a portion of the source region 7A at one end and to a portion of the second field oxide layer 2B at the other end, is formed to be isolated to the silicon substrate 1, the interpoly insulating layer 11a, the floating gate oxide layer 14, the second field oxide layer 2B and the control gate 10A by the tunnel oxide layer 5A.

Electrical operation of the flash EEPROM cell according to the present invention will be described with reference to FIG. 3A and FIG. 3B.

Figure 3A:
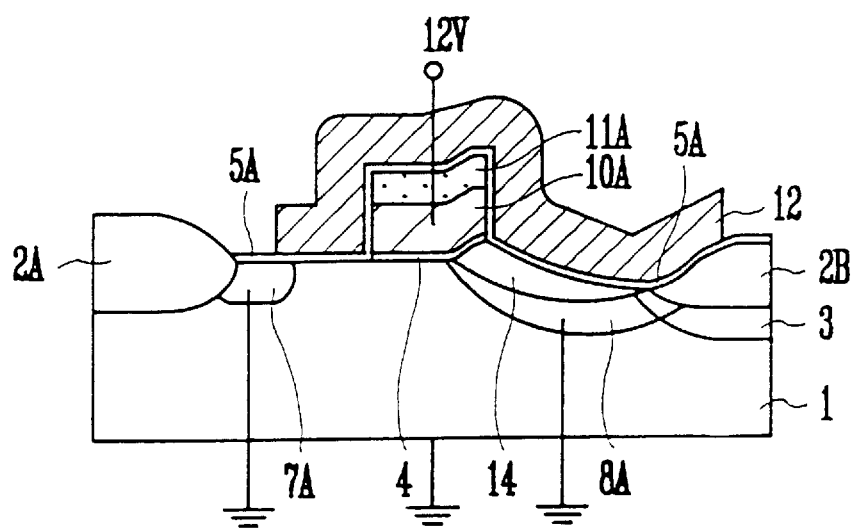
FIG. 3A and FIG. 3B are the state diagrams of the operation for explaining the flash EEPROM cell manufactured according to the present invention.
Figure 3B:
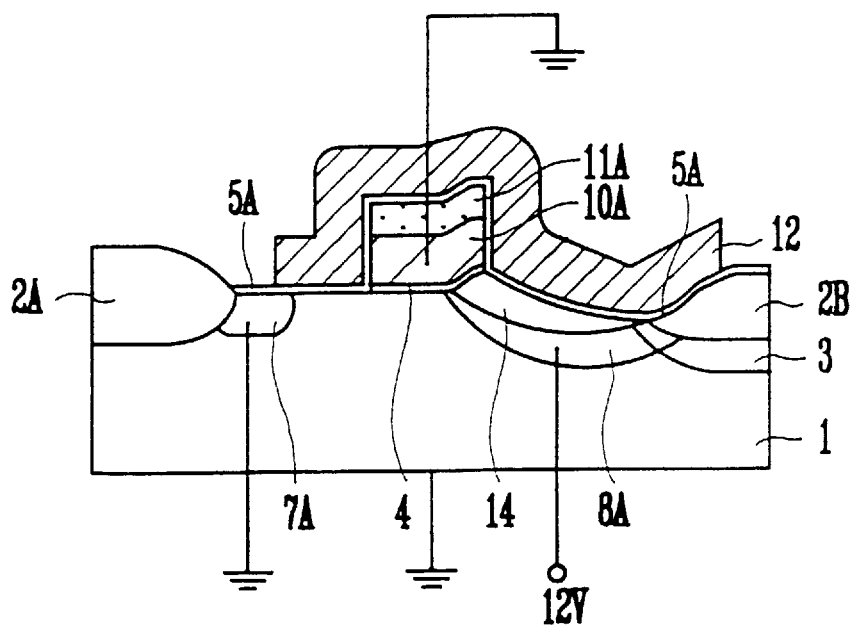

FIG. 3A and FIG. 3B are diagrams for explaining electrical operation of the flash EEPROM cell according to the present invention.

FIG. 3A is a diagram for explaining the program operation of the flash EEPROM cell.

When the silicon substrate 1, the source region 7A and the drain region 8A are grounded and a high voltage of 16 volts is applied to the control gate 10A, the flower-nordhim tunneling is occurred at the tunnel oxide layer 5A due to high electric field between the drain region 8A and the floating gate 12, so electrons are charged at the floating gate 12, thereby completing the program operation.

FIG. 3B is a diagram for explaining the erasure operation of the flash EEPROM cell. When the silicon substrate 1, the source region 7A and the control gate 10A are grounded, while a high voltage of about 12 volts is applied to the drain region 8A, the electrons, which are charged at the floating gate by the flower-nordhim tunneling occurred by the high electric field between the drain region 8A and the floating gate 12, are discharged, thereby completing the erasure operation.

As mentioned above, the flash EEPROM cell of split-gate type according to the present invention can prevent the degradation of the tunnel oxide film of the cell due to the band-to-band tunneling and the secondary hot carrier generated by a high electric field which is formed at the overlap region between the junction region and the gate electrode when the programming and erasure operations are performed by a high voltage to the structure in which the tunneling region is separated from the channel with a thick insulation film, while maintaining the advantage of split-gate structure which can prevent an over-erasure when the cell is driven.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A flash EEPROM cell comprising:

a silicon substrate having a first and a second field oxide layers;

a gate oxide layer, a control gate and an interpoly insulating layer formed on a portion of said silicon substrate between said first and said second field oxide layers in stack structure;

a floating gate oxide layer on a surface of said silicon substrate between said control gate and said second field oxide layer, so that portion of said silicon substrate adjacent to said second field oxide layer is exposed, wherein a portion of said floating gate oxide layer near said control gate is formed thicker than other portion of said floating gate oxide layer near said second field oxide layer;

a buried drain region formed under said second field oxide layer;

a drain region formed under said floating gate oxide layer, wherein said drain region is connected to said buried drain region;

a source region formed in a portion of said silicon substrate between said control gate and said first field oxide layer;

a tunnel oxide layer formed to isolate said silicon substrate, said interpoly insulating layer and said control gate; and a floating gate formed on said tunnel oxide layer.

2. A flash EEPROM cell of claim 1, wherein said first and second field oxide layers are formed of thickness of 2,000 through 5,000 Å by means of the LOCOS process.

3. A flash EEPROM cell of claim 1, wherein said gate oxide layer is formed of thickness of 300 through 500 Å.

4. A flash EEPROM cell of claim 1, wherein said interpoly insulating layer is formed of double structure having an oxide layer and a nitride layer.

5. A flash EEPROM cell of claim 1, wherein said tunnel oxide layer is formed of thickness of 80 through 120 Å.

* * * * *